US008675178B2

(12) United States Patent
Mengel

(10) Patent No.: US 8,675,178 B2
(45) Date of Patent: Mar. 18, 2014

(54) MICROLITHOGRAPHIC PROJECTION EXPOSURE APPARATUS

(75) Inventor: Markus Mengel, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1134 days.

(21) Appl. No.: 12/197,567

(22) Filed: Aug. 25, 2008

(65) Prior Publication Data

US 2009/0040498 A1 Feb. 12, 2009

Related U.S. Application Data

(63) Continuation of application No. PCT/EP2007/057776, filed on Jul. 27, 2007.

(30) Foreign Application Priority Data

Aug. 17, 2006 (DE) .................... 10 2006 038 643

(51) Int. Cl.
*G03B 27/72* (2006.01)
*G03B 27/54* (2006.01)
*G03F 7/20* (2006.01)

(52) U.S. Cl.
CPC ........ *G03F 7/70125* (2013.01); *G03F 7/70091* (2013.01); *G03F 7/70041* (2013.01); *G03F 7/70191* (2013.01); *G03F 7/70566* (2013.01); *G03F 7/701* (2013.01); *G03F 7/70158* (2013.01)
USPC .............................................. 355/71; 355/67

(58) Field of Classification Search
CPC ............ G03F 7/70091; G03F 7/70191; G03F 7/70158; G03F 7/70566; G03F 7/70041; G03F 7/70125; G03F 7/701

USPC ...................................................... 355/67, 71
See application file for complete search history.

(56) References Cited

U.S. PATENT DOCUMENTS

| 4,819,033 A | 4/1989 | Yoshitake et al. |
| 4,947,047 A | 8/1990 | Muraki |
| 5,442,184 A | 8/1995 | Palmer et al. |
| 5,652,673 A | 7/1997 | Oakberg |
| 5,673,103 A | 9/1997 | Inoue et al. |

(Continued)

FOREIGN PATENT DOCUMENTS

| CN | 101025573 | 8/2007 |
| DE | 199 21 795 | 11/2000 |

(Continued)

OTHER PUBLICATIONS

English translation of Japanese Office Action for corresponding JP Appl. No. 2009-524157 dated Jul. 8, 2010.

(Continued)

*Primary Examiner* — Steven H Whitesell Gordon
(74) *Attorney, Agent, or Firm* — Fish & Richardson P.C.

(57) ABSTRACT

A microlithographic projection exposure apparatus and method are provided. In some embodiments, a microlithographic projection exposure apparatus includes a light source to generate pulsed light, an illumination device, a projection objective, and at least one photoelastic modulator between the pulsed light source and the illumination device. The illumination device is configured to illuminate an object plane of the projection objective. The projection object projects an image of an object in the object plane of the projection objective to the image plane of the projection objective.

20 Claims, 4 Drawing Sheets

(56) References Cited

U.S. PATENT DOCUMENTS

| | | | |
|---|---|---|---|
| 5,744,721 A | 4/1998 | Varnum | |
| 5,815,247 A * | 9/1998 | Poschenrieder et al. | 355/71 |
| 5,886,810 A | 3/1999 | Siahpoushan et al. | |
| 6,268,914 B1 | 7/2001 | Wang | |
| 6,473,179 B1 | 10/2002 | Wang et al. | |
| 6,473,181 B1 | 10/2002 | Oakberg | |
| 6,483,573 B1 | 11/2002 | Schuster | |
| 6,829,040 B1 | 12/2004 | Kye et al. | |
| 7,345,741 B2 | 3/2008 | Shiozawa et al. | |
| 2003/0038931 A1* | 2/2003 | Toyoda et al. | 355/67 |
| 2003/0095260 A1 | 5/2003 | Yoneda et al. | |
| 2004/0262500 A1 | 12/2004 | Mengel | |
| 2005/0140958 A1 | 6/2005 | Fiolka et al. | |
| 2005/0225829 A1 | 10/2005 | Schenker | |
| 2005/0280794 A1* | 12/2005 | Tsuji | 355/67 |
| 2006/0055909 A1 | 3/2006 | Fiolka et al. | |
| 2007/0058151 A1* | 3/2007 | Eurlings et al. | 355/71 |
| 2007/0195305 A1 | 8/2007 | Mulder et al. | |
| 2008/0013065 A1* | 1/2008 | Kohl | 355/67 |
| 2009/0174877 A1 | 7/2009 | Mulder et al. | |
| 2011/0063597 A1 | 3/2011 | Mengel | |

FOREIGN PATENT DOCUMENTS

| | | |
|---|---|---|
| DE | 19921795 | 11/2000 |
| DE | 10 2006 032 810 | 1/2008 |
| EP | 1 367 446 | 12/2003 |
| EP | 1 826 616 | 8/2007 |
| EP | 1 879 071 | 1/2008 |
| JP | 6-053120 | 2/1994 |
| JP | 7-201723 | 8/1995 |
| JP | 2000-323403 | 11/2000 |
| JP | 2001-302255 | 10/2001 |
| JP | 2006-19702 | 1/2006 |
| JP | 2006-515958 | 6/2006 |
| WO | WO 03/007045 | 1/2003 |
| WO | WO 2004/066028 | 8/2004 |
| WO | WO 2005/026843 | 3/2005 |
| WO | WO 2005/027207 | 3/2005 |
| WO | WO 2005/069081 | 7/2005 |
| WO | WO 2005/116772 | 12/2005 |
| WO | WO 2006/040184 | 4/2006 |
| WO | WO 2006/040184 A2 | 4/2006 |

OTHER PUBLICATIONS

Summary of Office Action and Proposal of Response TW Patent Appl. No. 096130260, dated Jan. 10, 2011.

The International Preliminary Report on Patentability and a Written Opinion from the counterpart PCT Application No. PCT/EP2007/057776, dated Feb. 26, 2009.

\* cited by examiner

Fig. 4
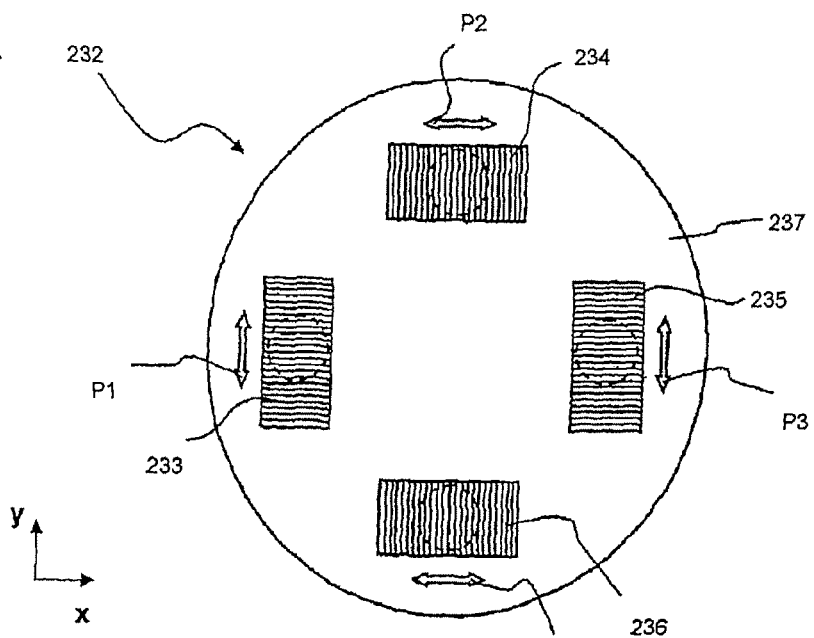
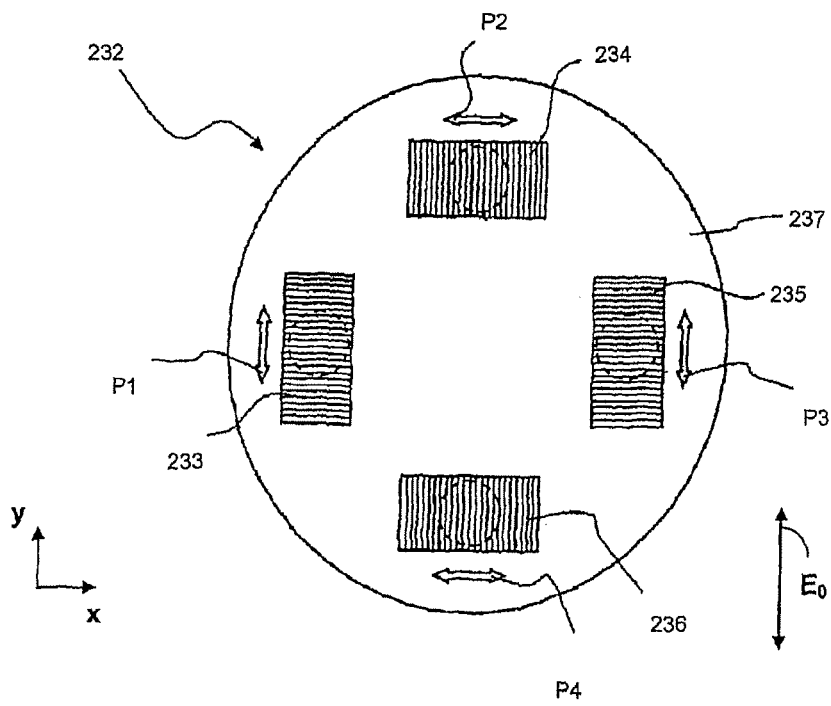

MICROLITHOGRAPHIC PROJECTION EXPOSURE APPARATUS

CROSS-REFERENCE TO RELATED APPLICATIONS

This application is a continuation of international patent application PCT/EP2007/057776, filed Jul. 27, 2007, which claims the benefit of German patent application serial number DE 10 2006 038 643.4, filed Aug. 17, 2006. International patent application PCT/EP2007/057776 is incorporated herein by reference in it entirety.

FIELD

The disclosure relates to a microlithographic projection exposure apparatus, and to a microlithographic exposure method.

BACKGROUND

Microlithographic projection exposure apparatuses are used for the fabrication of microstructured components such as, for example, integrated circuits or LCDs. Such a projection exposure apparatus typically has an illumination device and a projection objective. In the microlithography process, in general, an illumination device is used to illuminate a mask (reticle) whose image is then projected onto a substrate, such as a silicon wafer, via a projection objective. Usually, the substrate is coated with a light-sensitive layer (photoresist) which is arranged in the image plane of the projection objective so that the mask structure is transferred to the light-sensitive coating of the substrate.

SUMMARY

In some embodiments, the disclosure provides a microlithographic projection exposure apparatus and a microlithographic exposure method by which a pulse-resolved modulation of the polarization state can be achieved without involving movable, such as rotating, optical components.

In certain embodiments, the disclosure provides a microlithographic projection exposure apparatus that includes a pulsed light source configured to generate pulsed light, an illumination device, a projection objective, and at least one photoelastic modulator between the pulsed light source and the illumination device. The illumination device is configured to illuminate the object plane of the projection objective, and the projection objective is configured to project an image from the object plane of the projection objective to the image plane of the projection objective.

The photoelastic modulator can be subjected to a temporally varying retardation by suitable (e.g. acoustic) excitation. The retardation may in turn be temporally correlated with the pulsed light, such that individual (e.g. successive) pulses of the pulsed light are subjected in each case to a defined retardation and hence to a defined alteration of the polarization state. The alteration can also be different for individual pulses. Movable, such as rotating, optical components can be avoided by using a photoelastic modulator to generate the pulse-resolved variation of the polarization state. This can avoid, for example, stress birefringence induced in such components on account of, for example, centrifugal forces that occur, as well as undesirable influencing of the polarization distribution associated with such stress birefringence.

In some embodiments, by way of example, the above-mentioned temporal correlation can be effected in such a way that two successive pulses of the pulsed light cancel one another out in terms of their polarization effect after emerging from the photoelastic modulator, or are oriented orthogonally with respect to one another in terms of their polarization direction upon emerging from the photoelastic modulator, in order to generate unpolarized light in the illumination device as a result.

In certain embodiments, a polarization-influencing optical element is included in the illumination device.

In the context of the present application, a polarization-influencing optical element should be understood to mean, in principle, any element which has the property of converting an input polarization state of light impinging on the element into a different polarization state, whether it be by rotating the preferred direction of polarization of the light, filtering out the light component of a specific polarization state or converting a first polarization state into a second polarization state. Furthermore, the polarization state can be changed, in principle, both in transmission and in reflection or absorption of the light component of a polarization state.

In some embodiments, the polarization-influencing optical element has four polarizer elements, which are arranged offset by 90° relative to one another in the circumferential direction about an optical axis of the illumination device, two polarizer elements that lie opposite one another being transmissive to light of a first polarization direction and the remaining two polarizer elements being transmissive to light of a second polarization direction perpendicular thereto.

With such a polarization-influencing optical element, in conjunction with a pulse-resolved change in the polarization direction that is carried out according to the manner described above, it is possible, for example, to change between a horizontal illumination setting polarized in the vertical direction and a vertical illumination setting polarized in the horizontal direction, such that it is possible to switch between an illumination setting optimized for vertical structures and an illumination setting optimized for horizontal structures without movable parts and in rapid succession.

In certain embodiments, the polarization-influencing optical element is arranged in a pupil plane of the illumination device.

In some embodiments, the polarization-influencing optical element is a polarization filter.

In certain embodiments, the disclosure provides a microlithographic exposure method, in which pulsed light is provided to an illumination device of a projection exposure apparatus. Pulses of the pulsed light are subjected to changes in their polarization state before entering into the illumination device. The changes in the polarization state are effected using at least one photoelastic modulator arranged in the beam path of the pulsed light.

In some embodiments, the disclosure provides a photoelastic modulator in a microlithographic projection exposure apparatus. The photoelastic modulator provides pulse-resolved changes of the polarization state of light passing through the projection exposure apparatus.

Further configurations of the disclosure can be gathered from the description, drawings and claims.

BRIEF DESCRIPTION OF THE DRAWINGS

The disclosure is explained in more detail below on the basis of exemplary embodiments illustrated in the accompanying figures, in which:

FIGS. 4a-b show schematic illustrations for elucidating the effect of the element from FIG. 3 upon irradiation with light of different polarization directions.

DETAILED DESCRIPTION

Figure 1:
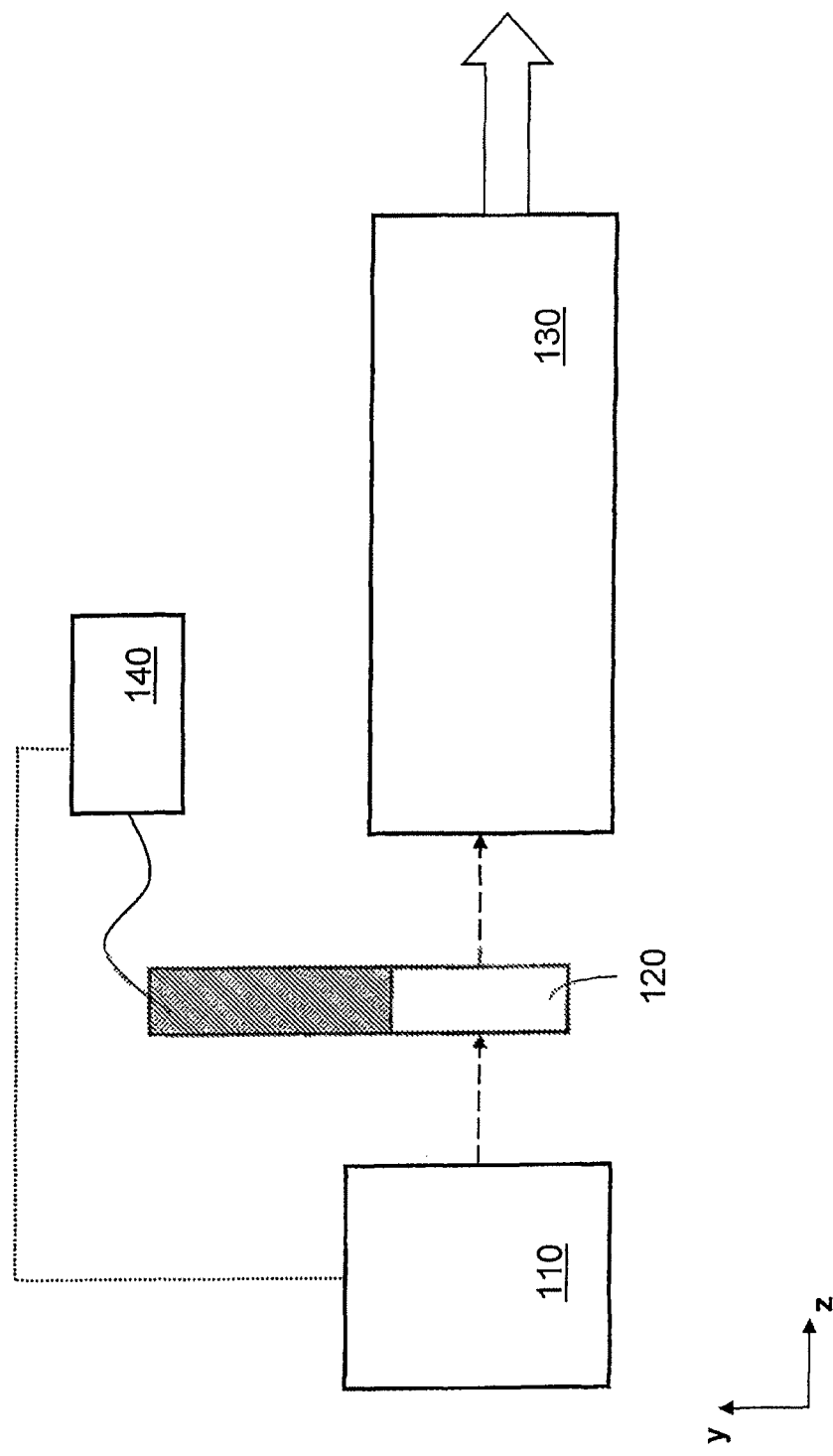
FIG. 1 shows a schematic illustration of part of a microlithographic projection exposure apparatus.

FIG. 1 shows a pulsed light source 110, which generates polarized light. The pulsed light source 110 is typically an excimer laser, such as an ArF laser having an operating wavelength of 193 nm. A photoelastic modulator (PEM) is downstream of the pulsed light source 110 in the direction of light propagation running in the direction of the arrow in FIG. 1. An illumination device 130 of a microlithographic projection exposure apparatus is downstream of PEM 120 in the direction of light propagation.

In general, a PEM is an optical component that is produced from a material exhibiting stress birefringence in such a way that an excitation of the PEM to effect acoustic vibrations leads to a periodically varying mechanical stress and a temporally varying retardation. "Retardation" denotes the difference in the optical paths of two orthogonal (mutually perpendicular) polarization states. PEMs are disclosed, for example, in U.S. Pat. No. 5,886,810 or U.S. Pat. No. 5,744,721. PEMs configured to be used at wavelengths of visible light through to the VUV range (approximately 130 nm) are commercially available from, for example, by the company Hinds Instruments Inc., Hillsboro, Oreg. (USA).

The PEM 120 is excited to effect acoustic vibrations via an excitation unit 140 such that a retardation that varies temporally with a modulation frequency forms in the PEM 120. In general, the modulation frequency is dependent on the mechanical dimensioning of the PEM 120 and typically is in the region of a few tens of kHz. It is assumed in FIG. 1, then, that the pressure direction or the vibration direction is arranged at an angle of 45° relative to the polarization direction of the laser light that is emitted by the pulsed light source 110 and impinges on the PEM 120. The excitation of the PEM 120 by the excitation unit 140 is correlated with the emission from the pulsed light source 110 via suitable trigger electronics.

The pulsed light source 110 generates a first pulse, then, at a point in time at which the retardation in the PEM 120 is precisely zero. A second pulse is generated by the pulsed light source 110 at a point in time at which the retardation in the PEM 120 amounts to half the operating wavelength, that is to say $\lambda/2$. The PEM 120 therefore acts on the second pulse as a lambda/2 plate, such that the polarization direction of the second light pulse upon emerging from the PEM 120 is rotated by 90° with respect to its polarization direction upon entering into the PEM 120. Since the PEM 120 is operated at a frequency of a few tens of kHz and the period duration of the excited vibration of the PEM 120 is therefore long in comparison with the pulse duration (approximately 10 nanoseconds) of the pulsed light source 110, a quasi-static retardation acts on the light from the pulsed light source 110 in the PEM 120 during the pulse duration.

Since the two pulses described above are oriented orthogonally with respect to one another in terms of their polarization direction when emerging from the PEM 120, they cancel one another out in pairs in terms of their polarization effect after emerging from the PEM 120 or upon entering into the illumination device 130. Consequently, unpolarized light is produced as a result of the superimposition in the illumination device.

In some embodiments, the excitation of the PEM 120 by the excitation unit 140 is correlated with the emission from the pulsed light source 110 in such a way that a first pulse passes through the PEM 120 at a point in time at which the retardation in the PEM amounts to one quarter of the operating wavelength, that is to say $\lambda/4$, (which leads e.g. to left circularly polarized light), and a second pulse is generated by the pulsed light source 110 at a point in time at which the retardation in the PEM 120 is of identical magnitude and opposite sign, that is to say amounts to $\lambda/4$ (which then leads to right circularly polarized light) or vice versa. Consequently, the superimposition of a multiplicity of such pairs of light pulses likewise produces unpolarized light when emerging from the PEM 120 or entering into the illumination device 130.

Figure 2:
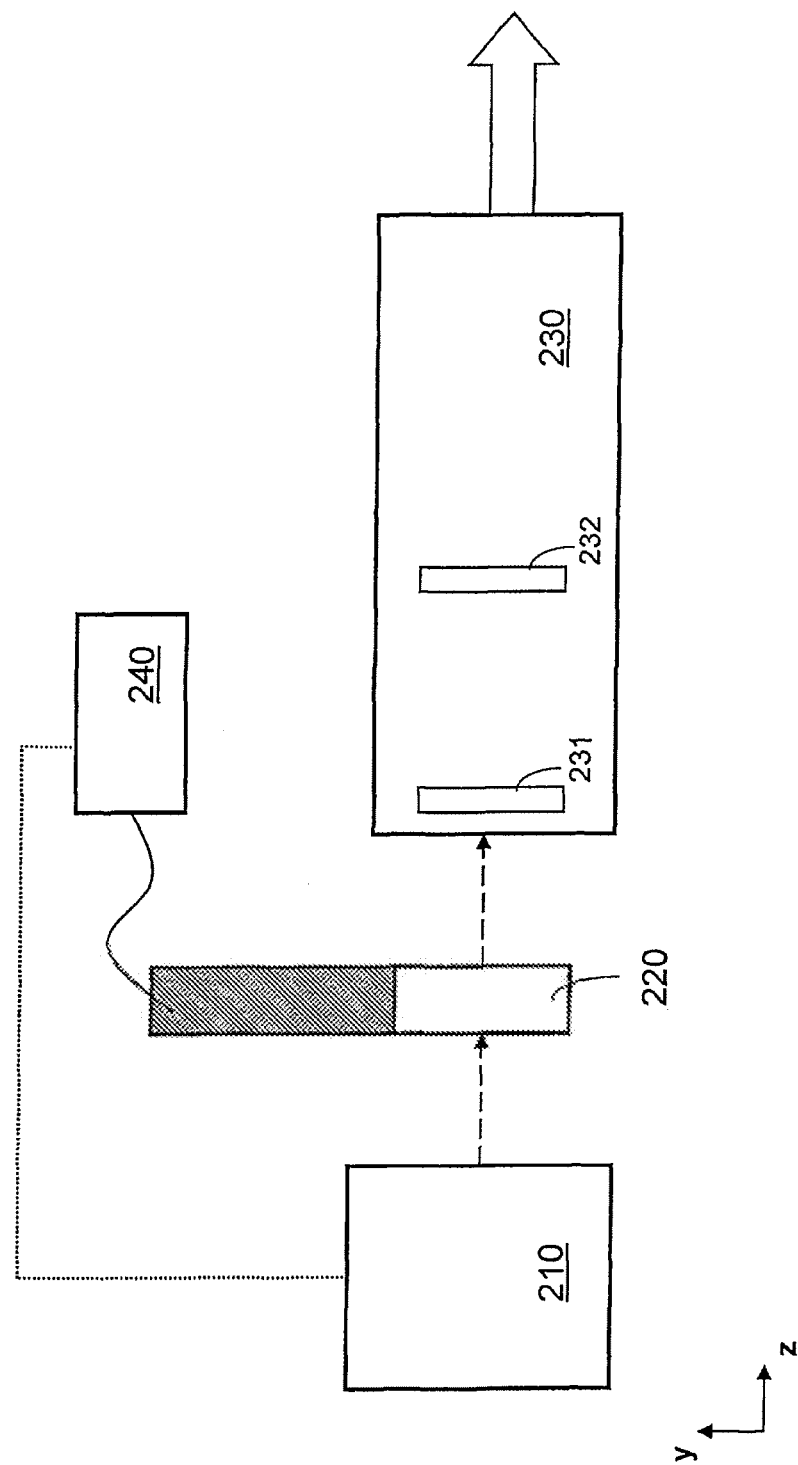
FIG. 2 shows a schematic illustration of part of a microlithographic projection exposure apparatus.

In FIG. 2, elements with like reference numbers are as noted above with respect to FIG. 1. In FIG. 2, a polarization-influencing optical element 232 is situated in a pupil plane of the illumination device 230, the construction of the optical element being explained in more detail with reference to FIG. 3.

The polarization-influencing optical element 232 has an arrangement including four polarizer elements 233 to 236 which are arranged offset by 90° in each case in a light-opaque carrier 237. Such a polarization-influencing optical element is described, for example, in US2005/0140958 A1. The polarization directions or transmission directions of the individual polarizer elements 233 to 236 are designated on the basis of the double-headed arrows P1 to P4 in FIG. 3. The polarizer elements 233 to 236 themselves can be constructed from polarization-selective beam splitter layers joined to one another in pairs in a known manner (described in US2005/0140958 A1 mentioned above).

As illustrated schematically in FIG. 4a and 4b, via the method already described with reference to FIG. 1, the polarization direction of the light emerging from the pulsed light source 210 is modified before entering into the illumination device 230 in such a way that the polarization direction varies between the x-direction (FIG. 4a) and the y-direction (FIG. 4b) in pulse-resolved fashion. In the first-mentioned case, that is to say upon setting the polarization direction in the x-direction in accordance with FIG. 4a, by virtue of the effect of the polarization-influencing optical element 232, the light polarized in this way is transmitted only by the polarizer elements 234 and 236, whereas it is blocked by the polarizer elements 233 and 235. By contrast, upon setting the polarization direction in the y-direction in accordance with FIG. 4b, the light polarized in this way is transmitted only by the polarizer elements 233 and 235, whereas it is blocked by the polarizer elements 234 and 236.

Figure 3:
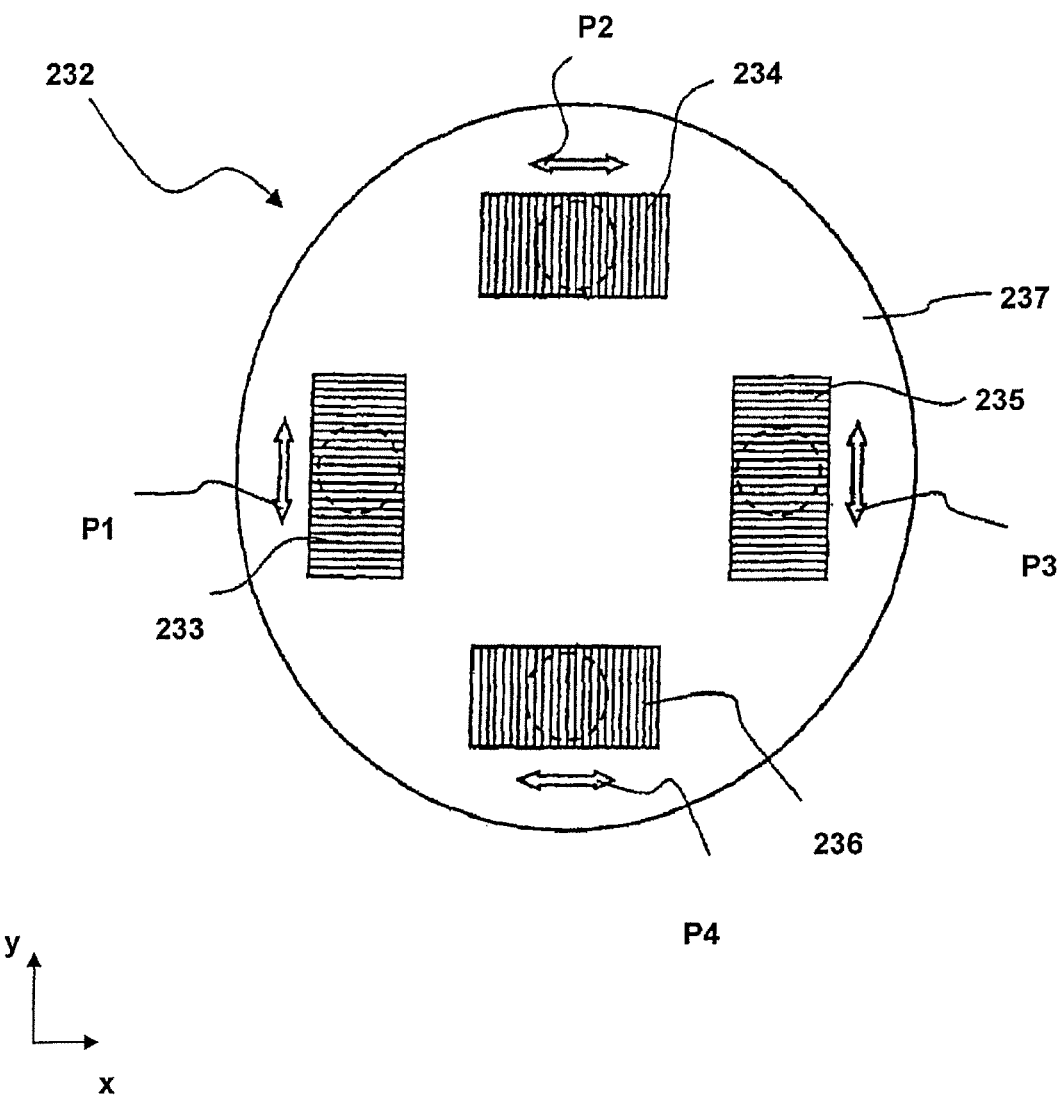
FIG. 3 shows a schematic illustration of a polarization-influencing optical element used in the projection exposure apparatus of FIG. 2, in plan view.

As a result, in FIGS. 2 to 4, a horizontal illumination setting polarized in the vertical direction (y-direction) varies in pulse-resolved fashion with a vertical illumination setting polarized in the horizontal direction. In this way, it is possible to switch between an illumination setting optimized for vertical structures and an illumination setting optimized for horizontal structures without movable parts and in rapid succession.

A diffractive optical element (DOE) 231, which is used in the illumination device 230 and is depicted schematically in FIG. 2, can be designed such that only the four partial elements 233 to 236 in the pupil plane are illuminated (so-called quadrupole DOE).

Even though the disclosure has been described on the basis of specific embodiments, numerous variations and alternative embodiments can be deduced by the person skilled in the art, e.g. by combination and/or exchange of features of individual embodiments. Accordingly, it goes without saying for the person skilled in the art that such variations and alternative embodiments are also encompassed by the present disclosure, and the scope of the disclosure is only restricted within the meaning of the accompanying patent claims and the equivalents thereof.

The invention claimed is:

1. An apparatus, comprising:
   a light source configured to generate pulsed light;
   an illumination device;
   a projection objective having an object plane and an image plane;
   a polarization-influencing optical element comprising first, second, third and fourth polarizer elements offset by 90° relative to one another in a circumferential direction about an optical axis of the illumination device, and wherein the first and second polarizer elements lie opposite one another and are transmissive to light of a first polarization direction, and wherein the third and fourth polarizer elements are transmissive to light of a second polarization direction perpendicular to the first polarization direction; and
   a photoelastic modulator between the light source and the illumination device,
   wherein the illumination device is configured to illuminate the object plane of the projection objective during use, the projection objective is designed to project an image in the object plane of the projection objective to the image plane of the projection objective during use, and the apparatus is a microlithographic projection exposure apparatus;
   wherein the apparatus is configured so that during use of the apparatus:
      the pulsed light emitted from the light source is modified by the photoelastic modulator and the polarization-influencing optical element so that a spatial distribution and polarization direction of the light emerging from the polarization-influencing optical element varies in a pulse-resolved fashion; and
      an illumination setting provided by the illumination device to illuminate a mask in the object plane is switched between a first polarized illumination setting optimized for a structure of the mask extending along a first direction and a second polarized illumination setting optimized for a structure of the mask extending along a second direction perpendicular to the first direction.

2. The apparatus according to claim 1, further comprising an excitation unit configured to excite the photoelastic modulator with a temporally varying retardation during use, wherein the temporally varying retardation is temporally correlated with the pulsed light.

3. The apparatus according to claim 2, wherein during use individual pulses of the pulsed light have a defined polarization state after emerging from the photoelastic modulator.

4. The apparatus according to claim 1, wherein during use polarization states of individual pulses of the pulsed light are different after emerging from the photoelastic modulator relative to before impinging on the photoelastic modulator.

5. The apparatus according to claim 4, wherein during use at least two successive pulses of the pulsed light cancel one another out in terms of their polarization effect after emerging from the photoelastic modulator.

6. The apparatus according to claim 1, wherein the polarization-influencing optical element is a polarization filter.

7. The apparatus according to claim 1, wherein the polarization-influencing optical element is arranged in a pupil plane of the illumination device.

8. The apparatus according to claim 7, further comprising a diffractive optical element in the illumination device upstream of the polarization-influencing optical element in a direction of light propagation, wherein the diffractive optical element is configured so that essentially only the polarizer elements in the pupil plane are illuminated.

9. The apparatus according to claim 1, wherein during use the pulsed light has a wavelength of less than 250 nm.

10. A method, comprising:
    directing light emerging from the polarization-influencing optical element of claim 1 into the illumination device.

11. A method, comprising:
    exposing pulses of light to a photoelastic modulator so that after emerging from the photoelastic modulator the pulses of light have different polarization states relative to the polarization states of the pulses of light before being exposed to the photoelastic modulator;
    directing the pulses of light to impinge on a polarization-influencing optical element so that light emerging from the polarization-influencing optical element has spatial distributions and polarization states that vary in a pulse-resolved fashion; and
    using the pulses of light having different spatial positions and polarization states in an illumination device of a microlithographic projection exposure apparatus to illuminate a mask in the apparatus with a first polarized illumination setting optimized for a structure of the mask extending along a first direction and subsequently illuminating the mask with a second polarized illumination setting optimized for a structure of the mask extending along a second direction perpendicular to the first direction.

12. The method of claim 11, further comprising:
    illuminating the object plane of a projection objective by using the illumination device to direct light to the object plane; and
    using the projection objective in the microlithographic projection exposure apparatus to project an image in the object plane of the projection objective to the image plane of the projection objective.

13. A method, comprising:
    generating pulses of light with a light source;
    modifying the pulses of light using a photoelastic modulator, thereby producing modified pulses of light having pulse-resolved changes in polarization states and spatial distributions relative to the pulses of light generated by the light source;
    providing the modified pulses of light to an illumination device of a microlithographic projection exposure apparatus; and
    using the pulses to illuminate a mask in the apparatus with a first polarized illumination setting optimized for a structure of the mask extending along a first direction and subsequently illuminating the mask with a second polarized illumination setting optimized for a structure of the mask extending along a second direction perpendicular to the first direction.

14. The method of claim 13, further comprising using a diffractive optical element to direct light from the photoelastic modulator to impinge upon sub-regions of a polarization-influencing optical element.

15. The method of claim 14, wherein the sub-regions comprise first, second, third, and fourth polarizer elements offset by 90° relative to one another in a circumferential direction about a central axis of the polarization-influencing optical element.

16. The method of claim 15, further comprising using the diffractive optical element to direct light from the photoelastic modulator to simultaneously impinge upon each of the first, second, third, and fourth polarizer elements, and using the polarization-influencing optical element to block the light impinging upon two of the polarizer elements.

17. A microlithographic projection exposure apparatus comprising a photoelastic modulator and a polarization-influencing optical element between a light source and a projection objective;
  wherein during use polarization states and spatial distributions of successive individual pulses of light are different after emerging from the polarization-influencing optical element relative to before impinging on the photoelastic modulator; and
  wherein the apparatus is configured so that, during use of the apparatus, an illumination setting provided by the illumination device to illuminate a mask in the object plane is switched between a first polarized illumination setting optimized for a structure of the mask extending along a first direction and a second polarized illumination setting optimized for a structure of the mask extending along a second direction perpendicular to the first direction.

18. A method, comprising:
  directing light emerging from the polarization-influencing optical element of claim 17 into an illumination device of the microlithographic projection exposure apparatus.

19. The apparatus of claim 17, further comprising a diffractive optical element positioned between the light source and the polarization-influencing optical element, wherein the diffractive optical element is configured to direct light from the light source to impinge upon sub-regions of the polarization-influencing optical element.

20. The apparatus of claim 19, wherein the sub-regions comprise first, second, third, and fourth polarizer elements offset by 90° relative to one another in a circumferential direction about an optical axis of the microlithographic projection exposure apparatus, and wherein the diffractive optical element is configured to direct light from the light source to simultaneously impinge upon each of the polarizer elements.

* * * * *

UNITED STATES PATENT AND TRADEMARK OFFICE
CERTIFICATE OF CORRECTION

| | | |
|---|---|---|
| PATENT NO. | : 8,675,178 B2 | Page 1 of 1 |
| APPLICATION NO. | : 12/197567 | |
| DATED | : March 18, 2014 | |
| INVENTOR(S) | : Markus Mengel | |

It is certified that error appears in the above-identified patent and that said Letters Patent is hereby corrected as shown below:

In the Specification:

Col. 1, line 12, delete "it" an insert -- its --.

Signed and Sealed this
Third Day of June, 2014

Michelle K. Lee
*Deputy Director of the United States Patent and Trademark Office*